(12) United States Patent
Kojo

(10) Patent No.: US 11,152,910 B2
(45) Date of Patent: Oct. 19, 2021

(54) PIEZOELECTRIC RESONATOR DEVICE

(71) Applicant: Daishinku Corporation, Kakogawa (JP)

(72) Inventor: Takuya Kojo, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 342 days.

(21) Appl. No.: 16/338,695

(22) PCT Filed: Nov. 14, 2017

(86) PCT No.: PCT/JP2017/040966
§ 371 (c)(1),
(2) Date: Apr. 2, 2019

(87) PCT Pub. No.: WO2018/092776
PCT Pub. Date: May 24, 2018

(65) Prior Publication Data
US 2020/0044623 A1 Feb. 6, 2020

(30) Foreign Application Priority Data

Nov. 17, 2016 (JP) .............................. JP2016-223946

(51) Int. Cl.
*H03H 9/02* (2006.01)
*H03H 9/05* (2006.01)
(Continued)

(52) U.S. Cl.
CPC ...... *H03H 9/02125* (2013.01); *H03H 9/0514* (2013.01); *H03H 9/0552* (2013.01); *H03H 9/1035* (2013.01); *H03H 9/19* (2013.01)

(58) Field of Classification Search
CPC .. H03H 9/2125; H03H 9/0514; H03H 9/0552; H03H 9/1035; H03H 9/19; H03H 9/0547; H03H 9/0595; H03B 5/32
See application file for complete search history.

(56) References Cited

U.S. PATENT DOCUMENTS

| 6,373,169 | B1 * | 4/2002 | Wajima | ............... H03H 9/0514 310/320 |
| 2015/0115376 | A1 * | 4/2015 | Chen | ................... B81C 1/00293 257/415 |

FOREIGN PATENT DOCUMENTS

| JP | 2000-134058 A | 5/2000 |
| JP | 2008-066921 A | 3/2008 |

(Continued)

OTHER PUBLICATIONS

Machine translation of JP Pub 2008-066921.*

*Primary Examiner* — Jeffrey M Shin
(74) *Attorney, Agent, or Firm* — Metrolex IP Law Group, PLLC

(57) ABSTRACT

A crystal oscillator includes: a crystal resonator plate having a first excitation electrode and a second excitation electrode. A first sealing member covers the first excitation electrode of the crystal resonator plate. A second sealing member covers the second excitation electrode of the crystal resonator plate. An internal space is formed by bonding the first sealing member to the crystal resonator plate and the second sealing member to the crystal resonator plate, and seals a vibrating part of the crystal resonator plate. First and second shield electrodes are connected to a fixed potential (e.g. GND potential) in the internal space.

5 Claims, 12 Drawing Sheets

(51) Int. Cl.
H03H 9/10 (2006.01)
H03H 9/19 (2006.01)

(56) References Cited

FOREIGN PATENT DOCUMENTS

| | | |
|---|---|---|
| JP | 2010-252051 A | 11/2010 |
| JP | 2010-268439 A | 11/2010 |
| JP | 2012-090202 A | 5/2012 |

* cited by examiner

PIEZOELECTRIC RESONATOR DEVICE

TECHNICAL FIELD

The present invention relates to a piezoelectric resonator device.

BACKGROUND ART

Recently, in various electronic devices, the operating frequencies have increased and the package sizes (especially, the heights) have been decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

When capacitive coupling occurs between the excitation electrodes/wiring inside the package and board mounting terminals outside the package, the piezoelectric resonator device is affected by potential change in the board mounting terminals, which results in characteristic variations such as a frequency variation. In the conventional type piezoelectric resonator devices, the above characteristic variations are reduced with a shield structure made by, for example: disposing shield electrodes among the layers of the package; disposing an IC chip in the package, or using a metal plate as a lid of the package (see, for example, Patent Documents 2 and 3). The conventional type piezoelectric resonator device here means a so-called ceramic package device having a configuration in which a crystal resonator is sealed in a housing of the package made of ceramic.

PRIOR ART DOCUMENTS

Patent Documents

[Patent Document 1] JP 2010-252051 A
[Patent Document 2] JP 2000-134058 A
[Patent Document 3] JP 2012-090202 A

SUMMARY OF THE INVENTION

Problem to be Solved by the Invention

In the piezoelectric resonator device having the sandwich structure, the thickness of the package is small, which is likely to cause capacitive coupling. For this reason, for the piezoelectric resonator device having the sandwich structure also, it is important to take a measure for shielding, similarly to the piezoelectric resonator devices having the conventional configuration. However, if shield electrodes are provided similarly to the conventional piezoelectric resonator devices, the following problems may occur:

The piezoelectric resonator device having the sandwich structure does not have any lid of the package, unlike the conventional ceramic package device. Thus, it is not possible to make the package lid as the metal plate so as to obtain the shield structure. Also, if the shield electrodes are disposed among the layers of the package, the number of layers in the package is increased, which considerably deteriorates the thin structure as the advantageous feature of the sandwich structure.

The shield electrode is basically connected to the ground potential. When the grounded shield electrode is used for shielding, it is possible to prevent characteristic variations of the piezoelectric resonator device caused by the above-described potential change, because no potential change is generated in the shield electrode. However, capacitive coupling is generated between the shield electrode and the excitation electrode, which causes increase in parasitic capacitance of the excitation electrode. Thus, the frequency variable range of the piezoelectric resonator device is reduced and adjustment of the frequency becomes difficult.

The present invention was made in consideration of the above circumstances, an object of which is to provide a shield structure suitable for a piezoelectric resonator device having the sandwich structure.

Means for Solving the Problem

In order to solve the above problems, the present invention provides a piezoelectric resonator device that includes: a piezoelectric resonator plate including a first excitation electrode formed on a first main surface of a substrate, and a second excitation electrode formed on a second main surface of the substrate so as to make a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and by bonding the second sealing member to the piezoelectric resonator plate. The internal space thus hermetically seals a vibrating part including the first excitation electrode and the second excitation electrode of the piezoelectric resonator plate. Shield electrodes, which are not electrically connected to the first excitation electrode and the second excitation electrode but are connected to a fixed potential, are provided in the internal space.

With the above-described configuration, the shield electrodes are arranged in the internal space of the piezoelectric resonator device. The shield electrodes are not electrically connected to the first excitation electrode and the second excitation electrode, but connected to the fixed potential (preferably, the GND potential). In the piezoelectric resonator device having the sandwich structure, the thickness of the package is small. Thus, in such a piezoelectric resonator device, there are small distances respectively between the mounting terminals outside the package and the excitation electrodes/internal wiring, which tends to cause capacitive coupling. In contrast, in the piezoelectric resonator device of the present invention, since the shield electrodes are arranged in the internal space, it is possible to prevent characteristic variations due to the capacitive coupling.

Also in the above-described piezoelectric resonator device, the shield electrodes may be respectively patterned on inner surface sides of the first sealing member and the second sealing member at positions corresponding to shapes of the first excitation electrode and the second excitation electrode formed on the piezoelectric resonator plate, such that the shield electrodes are respectively superimposed on the first excitation electrode and the second excitation electrode in plan view.

With the above-described configuration, since the shield electrodes are patterned such that they conform with the respective shapes of arranged electrodes (or wiring) to be shielded, it is possible to minimize the area for forming the shield electrodes, which leads to reduction in parasitic capacitance generated by the shield electrodes. When the parasitic capacitance is reduced, it is possible to prevent reduction in the frequency variable amount of the excitation electrode, which leads to the frequency easily controlled in the piezoelectric resonator device.

Also in the above-described piezoelectric resonator device, the piezoelectric resonator plate includes: the vibrating part formed so as to have a substantially rectangular shape; an external frame part surrounding an outer periphery of the vibrating part; and a connecting part connecting the vibrating part to the external frame part. The shield electrodes may include an opening that is formed at a position facing respective edges of the first excitation electrode and the second excitation electrode. The edges are on a side opposed to a side having the connecting part of the vibrating part.

Since the excitation electrode is formed on the vibrating part, when the vibrating part is bent by impact or the like, the excitation electrode may make contact with the inner surface of the package, at the position of the maximum bending width thereof. Therefore, if the shield electrode is disposed at the position with which the excitation electrode makes contact, defects (such as short circuit) may be generated due to such contact of the excitation electrode with the shield electrode. With the above-described configuration, the opening is formed in the shield electrode at a position that is likely to make contact with the excitation electrode when the impact occurs, thus, it is possible to prevent the excitation electrode from making contact with the shield electrode on the inner surface of the package, which results in prevention of the above defects.

Also in the above-described piezoelectric resonator device, an external electrode terminal is formed on an outer surface of the second sealing member such that the piezoelectric resonator device is mounted on a circuit board. The shield electrode, which is formed on an inner surface of the second sealing member, may shield a region where the second excitation electrode is superimposed on the external electrode terminal while the other region facing the second excitation electrode is opened.

The capacitive coupling between the second excitation electrode and the external electrode terminal occurs at the region where the second excitation electrode is superimposed on the external electrode terminal. With the above-described configuration, the shield electrode formed on the inner surface of the second sealing member shields only the superimposed region of the second excitation electrode and the external electrode terminal. Since only the part that needs the shielding is shielded, it is possible to prevent reduction in the frequency variable amount of the excitation electrode due to the parasitic capacitance by the shield electrode while reducing characteristic variations due to the capacitive coupling.

Also in the above-described piezoelectric resonator device, an IC chip may be mounted on the first sealing member, and the shield electrode may be disposed on a surface on which the IC chip is mounted.

In the case in which the IC chip is mounted on the upper surface (i.e. on the first sealing member) of the piezoelectric resonator device, sometimes it is preferable to shield the capacitive coupling with the IC chip. With the above-described configuration, it is possible to dispose the shield for the IC chip outside the package when there is no space to dispose the shield electrode in the package.

Effect of the Invention

In the piezoelectric resonator device of the present invention, the shield electrodes are arranged in the internal space of the piezoelectric resonator device. The shield electrodes are not electrically connected to the first excitation electrode and the second excitation electrode, but connected to the fixed potential (preferably, the GND potential). In the piezoelectric resonator device having the sandwich structure, the thickness of the package is small. Thus, in such a piezoelectric resonator device, there are small distances respectively between the mounting terminals outside the package and the excitation electrodes/internal wiring, which tends to cause capacitive coupling. In the piezoelectric resonator device of the present invention, since the shield electrodes are arranged in the internal space, it is possible to obtain an effect that characteristic variations due to the capacitive coupling can be reduced.

MEANS FOR CARRYING OUT THE INVENTION

[Basic Configuration of Piezoelectric Resonator Device]

Hereinafter, an embodiment of the present invention will be described in detail with reference to the drawings. Although a piezoelectric resonator device according to this embodiment has an advantageous configuration in a shield structure, first, the basic configuration of the piezoelectric resonator device except for the shield structure is described.

Figure 1:
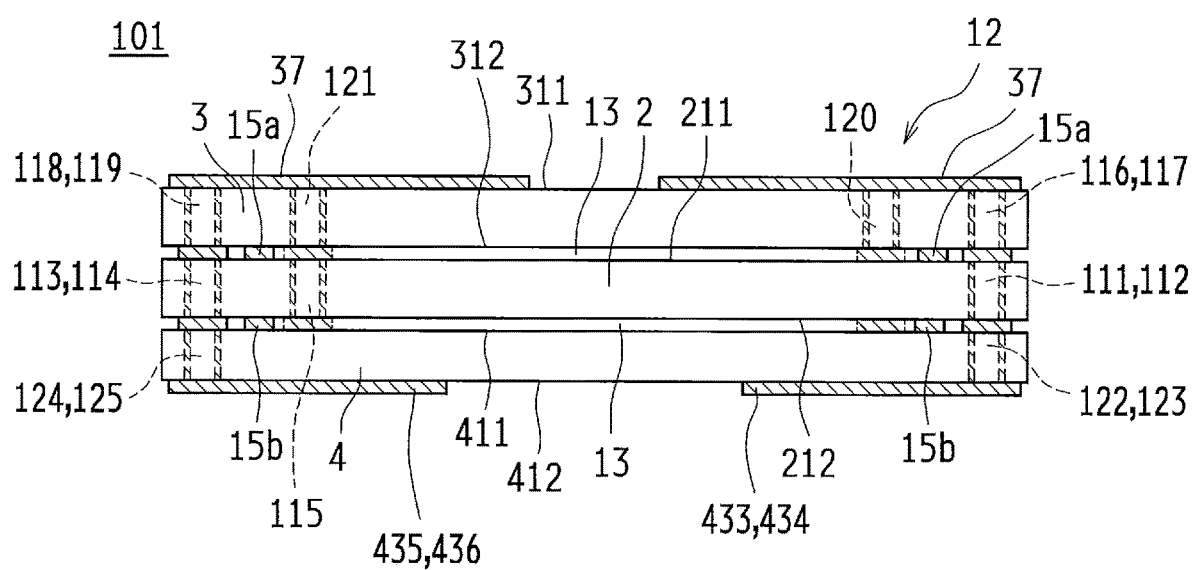
FIG. 1 is a schematic configuration diagram schematically illustrating a configuration of a crystal resonator according to an embodiment.
Figure 2:
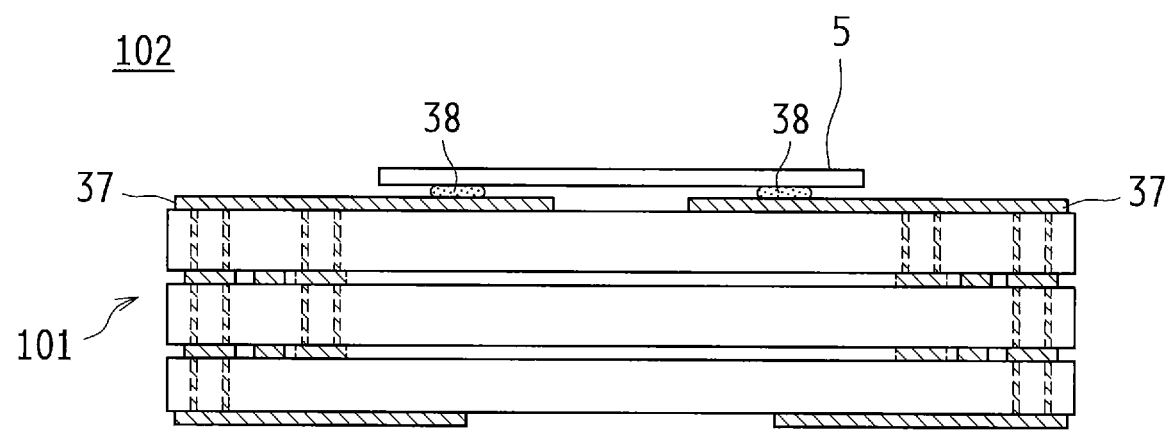
FIG. 2 is a schematic configuration diagram schematically illustrating a configuration of a crystal oscillator according to the embodiment.

FIG. 1 is a schematic configuration diagram schematically illustrating a configuration of a crystal resonator 101. FIG. 2 is a schematic configuration diagram schematically illustrating a configuration of a crystal oscillator 102. The crystal oscillator 102 shown in FIG. 2 is constituted of the crystal resonator 101 shown in FIG. 1 and an IC chip 5 mounted on an upper surface of the crystal resonator 101. The IC chip 5 as the electronic component element is a one-chip integrated circuit element constituting, with the crystal resonator 101, an oscillation circuit. The piezoelectric resonator device of the present invention means both a crystal resonator and a crystal oscillator.

As shown in FIG. 1, the crystal resonator 101 according to this embodiment includes a crystal resonator plate (piezoelectric resonator plate) 2, a first sealing member 3 and a second sealing member 4. In the crystal resonator 101, the crystal resonator plate 2 is bonded to the first sealing member 3, and also the crystal resonator plate 2 is bonded to the second sealing member 4. Thus, a package 12 having a sandwich structure is constituted. The first sealing member 3 is bonded to the crystal resonator plate 2 so as to cover a first excitation electrode 221 (see FIG. 5) formed on a first main surface 211 of the crystal resonator plate 2. The second sealing member 4 is bonded to the crystal resonator plate 2 so as to cover a second excitation electrode 222 (see FIG. 6) formed on a second main surface 212 of the crystal resonator plate 2.

In the crystal resonator 101, the first sealing member 3 and the second sealing member 4 are bonded respectively to the main surfaces (first main surface 211 and second main surface 212) of the crystal resonator plate 2, thus an internal space 13 of the package 12 is formed. In this internal space 13, a vibrating part 22 (see FIGS. 5 and 6) including the first excitation electrode 221 and the second excitation electrode 222 is hermetically sealed. The crystal resonator 101 according to this embodiment has, for example, a package size of 1.0×0.8 mm, which is reduced in size and height.

Next, the specific configuration of the above-described crystal resonator 101 is described referring to FIGS. 1 and 3 to 8. Here, each of the crystal resonator plate 2, the first sealing member 3 and the second sealing member 4 will be described as a single member.

Figure 5:
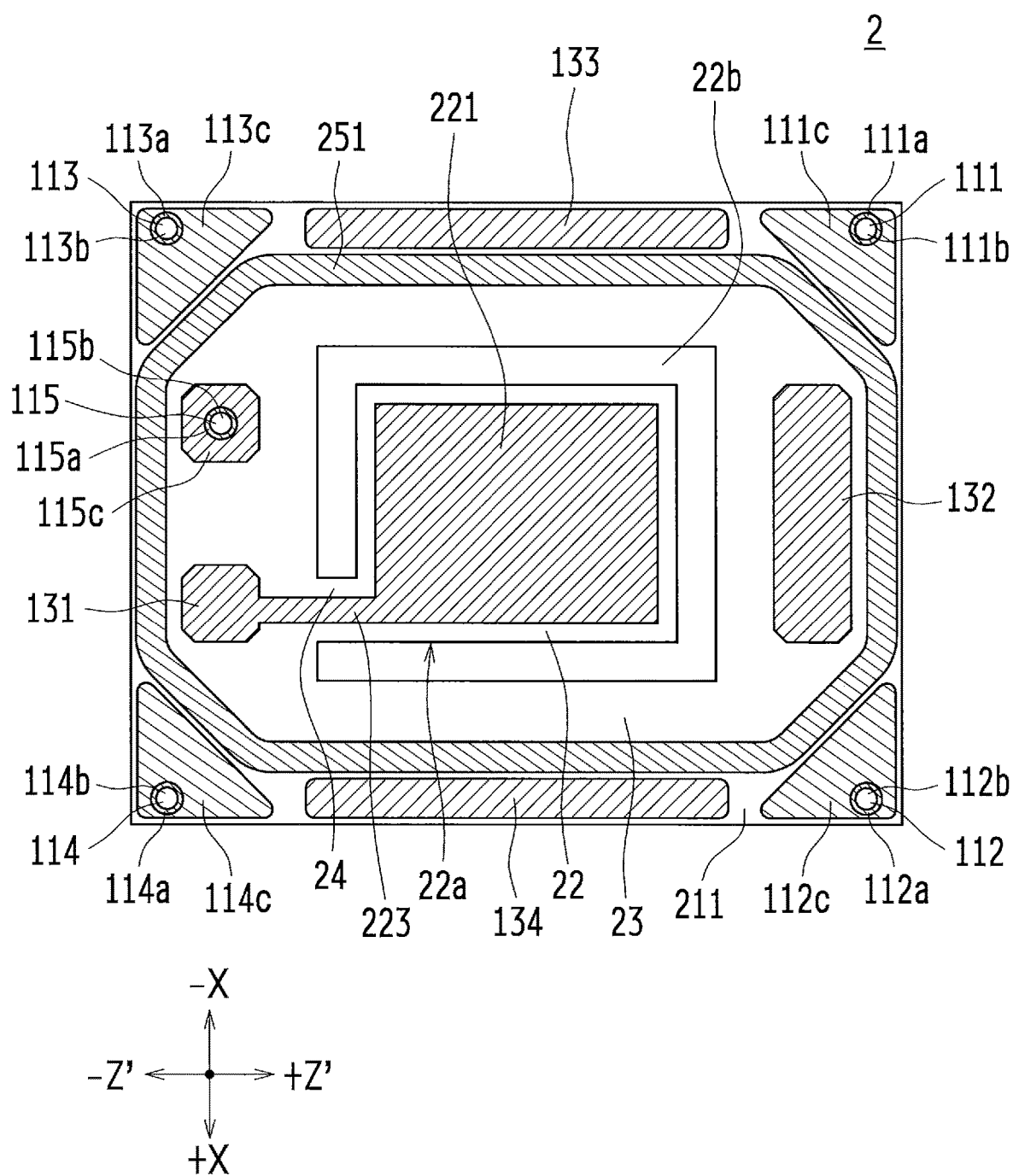
FIG. 5 is a schematic plan view illustrating a crystal resonator plate of the crystal resonator.
Figure 6:
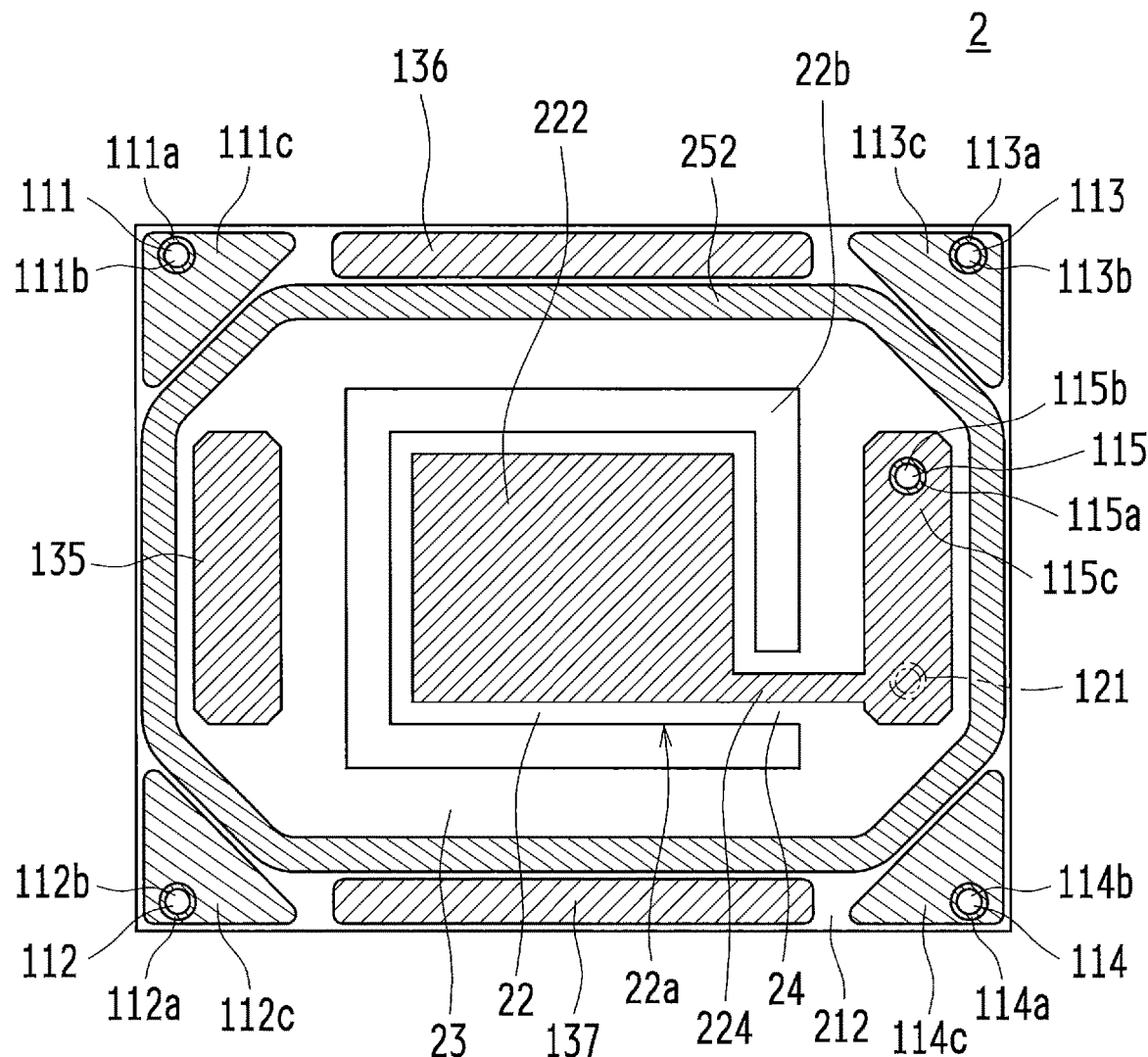
FIG. 6 is a schematic rear view illustrating the crystal resonator plate of the crystal resonator.

The crystal resonator plate 2 is a piezoelectric substrate made of crystal. As shown in FIGS. 5 and 6, both main surfaces 211 and 212 are formed as smooth flat surfaces (mirror-finished). In this embodiment, an AT-cut crystal plate that causes thickness shear vibration is used as the crystal resonator plate 2. In the crystal resonator plate 2 shown in FIGS. 5 and 6, each main surface 211 and 212 of the crystal resonator plate 2 is an XZ' plane. On this XZ' plane, the lateral direction (short side direction) of the crystal resonator plate 2 is the X axis direction, and the longitudinal direction (long side direction) of the crystal resonator plate 2 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the directions in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting part 24 that connects the vibrating part 22 to the external frame part 23. The vibrating part 22, the connecting part 24 and the external frame part 23 are integrally formed. In this embodiment, the connecting part 24 is provided at only one position between the vibrating part 22 and the external frame part 23, and the remaining part between the vibrating part 22 and the external frame part 23 on which the connecting part 24 is not provided is made as a space (clearance) 22b. The vibrating part 22 and the connecting part 24 are formed so as to have the thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) from only one corner part 22a positioned in the +X direction and in the −Z' direction of the vibrating part 22 to the external frame part 23 in the −Z' direction. Thus, since the connecting part 24 is disposed on the corner part 22a where displacement of the piezoelectric vibration is relatively small in an outer peripheral edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively.

The first excitation electrode 221 is provided on the first main surface of the vibrating part 22 while the second excitation electrode 222 is provided on the second main surface of the vibrating part 22. Extraction electrodes (a first extraction electrode 223 and a second extraction electrode 224) are respectively connected to the first excitation electrode 221 and the second excitation electrode 222. The first extraction electrode 223 is drawn from the first excitation electrode 221 and connected to a connection bonding pattern 131 formed on the external frame part 23 via the connecting part 24. The second extraction electrode 224 is drawn from the second excitation electrode 222 and connected to a connection bonding pattern 115c formed on the external frame part 23 via the connecting part 24. The first excitation electrode 221 and the first extraction electrode 223 are constituted of a base PVD film deposited on the first main surface 211 by physical vapor deposition, and an electrode PVD film deposited on the base PVD film by the physical vapor deposition. The second excitation electrode 222 and the second extraction electrode 224 are constituted of a base PVD film deposited on the second main surface 212 by the physical vapor deposition, and an electrode PVD film deposited on the base PVD film by the physical vapor deposition.

Resonator-plate-side sealing parts to bond the crystal resonator plate 2 respectively to the first sealing member 3 and the second sealing member 4 are provided on the respective main surfaces 211 and 212 of the crystal resonator plate 2. The resonator-plate-side sealing parts include: a resonator-plate-side first bonding pattern 251 formed on the first main surface 211 of the crystal resonator plate 2; and a resonator-plate-side second bonding pattern 252 formed on the second main surface 212 of the crystal resonator plate 2.

The resonator-plate-side first bonding pattern 251 and the resonator-plate-side second bonding pattern 252 are each formed on the external frame part 23 so as to have an annular shape in plan view. The first excitation electrode 221 and the second excitation electrode 222 are not electrically connected to the resonator-plate-side first bonding pattern 251 and the resonator-plate-side second bonding pattern 252.

The resonator-plate-side first bonding pattern 251 is constituted of a base PVD film deposited on the first main surface 211 by the physical vapor deposition, and an electrode PVD film deposited on the base PVD film by the physical vapor deposition. The resonator-plate-side second bonding pattern 252 is constituted of a base PVD film deposited on the second main surface 212 by the physical vapor deposition, and an electrode PVD film deposited on the base PVD film by the physical vapor deposition. That is, the resonator-plate-side first bonding pattern 251 and the resonator-plate-side second bonding pattern 252 have the same configuration in which a plurality of layers is laminated on each main surface 211 and 212, specifically, a Ti (titanium) layer and an Au (gold) layer are deposited by the vapor deposition in this order from the lowermost layer side. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. Similarly to the above, the second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration so that they are collectively formed in the same process. Similarly to the above, the second excitation electrode 222, the second extraction electrode 224 and the resonator-plate-side second bonding pattern 252 can have the same configuration so that they are collectively formed in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 5 and 6, five through holes (first to fifth through holes 111 to 115) are formed in the crystal resonator plate 2 so as to penetrate between the first main surface 211 and the second main surface 212. The first to fourth through holes 111 to 114 are respectively disposed in the external frame part 23, at the four corners (corner parts) of the crystal resonator plate 2. The fifth through hole 115 is disposed in the external frame part 23 of the crystal resonator plate 2, on one side in the Z' axis direction relative to the vibrating part 22 of the crystal resonator plate 2 (in FIGS. 5 and 6, on the side in the −Z' direction).

The first through hole 111 is connected to a sixth through hole 116 of the first sealing member 3 and to a twelfth through hole 122 of the second sealing member 4. The second through hole 112 is connected to a seventh through hole 117 of the first sealing member 3 and to a thirteenth through hole 123 of the second sealing member 4. The third through hole 113 is connected to an eighth through hole 118 of the first sealing member 3 and to a fourteenth through hole 124 of the second sealing member 4. The fourth through hole 114 is connected to a ninth through hole 119 of the first sealing member 3 and to a fifteenth through hole 125 of the second sealing member 4. The fifth through hole 115 is connected to the second extraction electrode 224 drawn from the second excitation electrode 222 and to a tenth through hole 120 of the first sealing member 3 via a wiring pattern 33.

In the first to fifth through holes 111 to 115, through electrodes 111a to 115a are respectively formed along a corresponding inner wall surface of the first to fifth through holes 111 to 115 so as to establish conduction between the electrodes formed on the first main surface 211 and the second main surface 212. Respective central parts of the first to fifth through holes 111 to 115 are hollow through parts 111b to 115b penetrating between the first main surface 211 and the second main surface 212. Connection bonding patterns 111c to 115c are formed on respective outer peripheries of the first to fifth through holes 111 to 115. The connection bonding patterns 111c to 115c are formed respectively on the main surfaces 211 and 212 of the crystal resonator plate 2.

The connection bonding patterns 111c to 115c have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each of the connection bonding patterns 111c to 115c is constituted of a base PVD film deposited on each main surface (the first main surface 211 and the second main surface 212) of the crystal resonator plate 2 by the physical vapor deposition, and an electrode PVD film deposited on the base PVD film by the physical vapor deposition.

The connection bonding patterns 111c to 114c formed on both first main surface 211 and second main surface 212 of the crystal resonator plate 2 are respectively provided at the four corners (corner parts) of the crystal resonator plate 2 so that they are provided at a predetermined interval from the resonator-plate-side first bonding pattern 251 and the resonator-plate-side second bonding pattern 252. The connection bonding pattern 115c formed on the second main surface 212 of the crystal resonator plate 2 extends on the external frame part 23 of the crystal resonator plate 2 in the X axis direction, and it is integrally formed with the second extraction electrode 224 drawn from the second excitation electrode 222.

On the first main surface 211 of the crystal resonator plate 2, the connection bonding pattern 131 is disposed, which is integrally formed with the first extraction electrode 223 drawn from the first excitation electrode 221. The connection bonding pattern 131 is disposed on the external frame part 23 of the crystal resonator plate 2, on the side in the −Z' direction relative to the vibrating part 22 of the crystal resonator plate 2. Also on the first main surface 211 of the crystal resonator plate 2, a connection bonding pattern 132 is disposed on the side opposite to the connection bonding pattern 131 in the Z' axis direction with the vibrating part 22 of the crystal resonator plate 2 being interposed therebetween. That is, the connection bonding patterns 131 and 132 are provided respectively on both sides in the Z' axis direction relative to the vibrating part 22. The connection bonding pattern 132 extends on the external frame part 23 of the crystal resonator plate 2 in the X axis direction.

Also on the first main surface 211 of the crystal resonator plate 2, connection bonding patterns 133 and 134 are disposed on the external frame part 23 of the crystal resonator plate 2, on both sides in the X axis direction relative to the vibrating part 22. The connection bonding patterns 133 and 134 are provided on regions close to the respective long sides (regions along the respective long sides) of the crystal resonator plate 2, and extend in the Z' axis direction. The connection bonding pattern 133 is disposed between the connection bonding pattern 111c and the connection bonding pattern 113c formed on the first main surface 211 of the crystal resonator plate 2. The connection bonding pattern 134 is disposed between the connection bonding pattern 112c and the connection bonding pattern 114c.

On the second main surface 212 of the crystal resonator plate 2, a connection bonding pattern 135 is disposed on the side opposite to the connection bonding pattern 115c in the Z' axis direction with the vibrating part 22 of the crystal resonator plate 2 being interposed therebetween. That is, the connection bonding patterns 115c and 135 are provided respectively on both sides in the Z' axis direction relative to the vibrating part 22. Also on the second main surface 212 of the crystal resonator plate 2, connection bonding patterns 136 and 137 are disposed on the external frame part 23 of the crystal resonator plate 2, on both sides in the X axis direction relative to the vibrating part 22. The connection bonding patterns 136 and 137 are provided on regions close to the respective long sides (regions along the respective long sides) of the crystal resonator plate 2, and extend in the Z' axis direction. The connection bonding pattern 136 is disposed between the connection bonding pattern 111c and the connection bonding pattern 113c formed on the second main surface 212 of the crystal resonator plate 2. The connection bonding pattern 137 is disposed between the connection bonding pattern 112c and the connection bonding pattern 114c.

In the crystal resonator 101, the first to fourth through holes 111 to 114 and the connection bonding patterns 111c to 114c, 133, 134, 136 and 137 are disposed outside the outer peripheries of the resonator-plate-side first bonding pattern 251 and the resonator-plate-side second bonding pattern 252. The fifth through hole 115 and the connection bonding patterns 115c, 131, 132 and 135 are disposed inside the inner peripheries of the resonator-plate-side first bonding pattern 251 and the resonator-plate-side second bonding pattern 252. The connection bonding patterns 111c to 115c and 131 to 137 are not electrically connected to the resonator-plate-side first bonding pattern 251 and the resonator-plate-side second bonding pattern 252.

Figure 3:
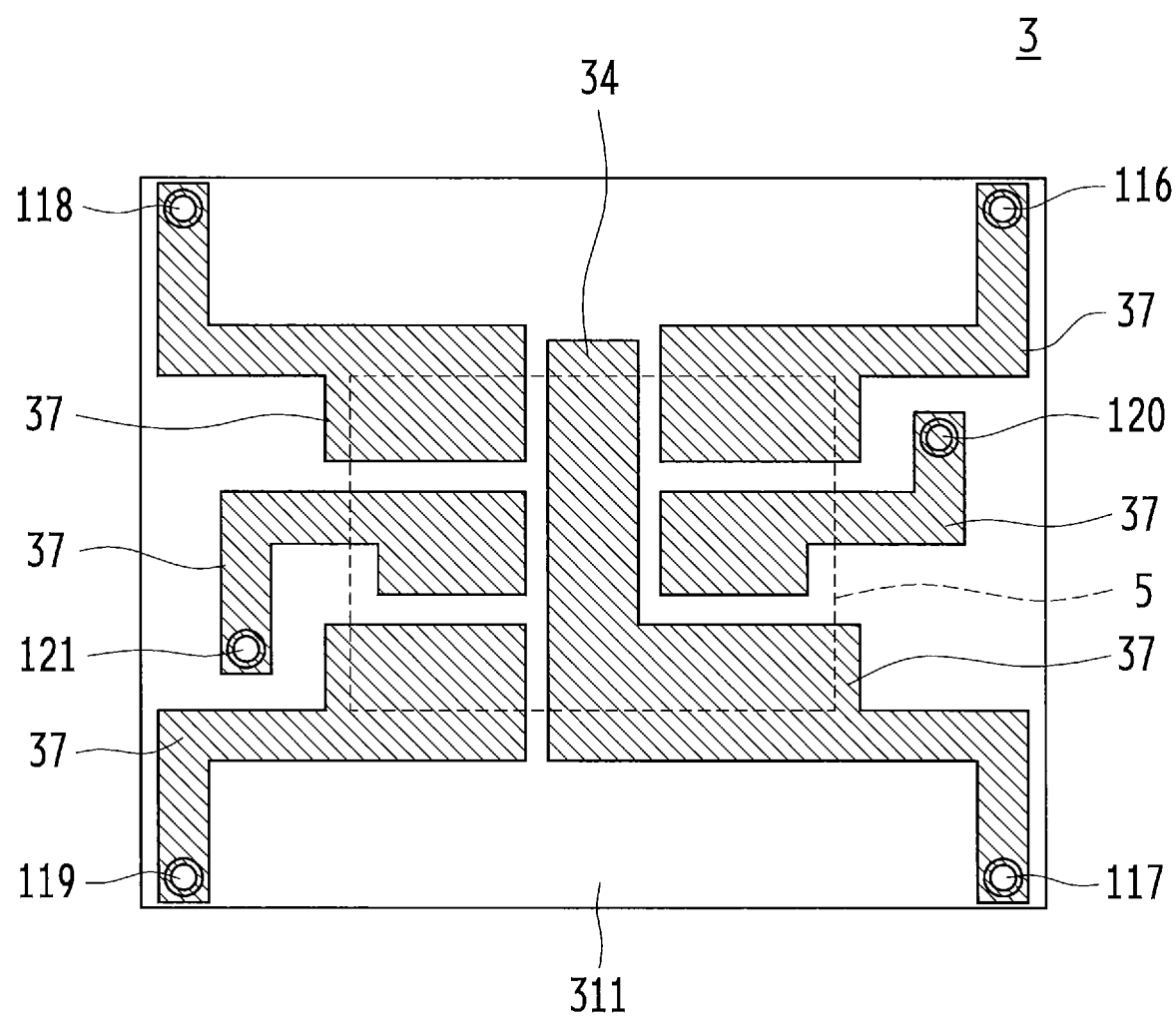
FIG. 3 is a schematic plan view illustrating a first sealing member of the crystal resonator.
Figure 3:
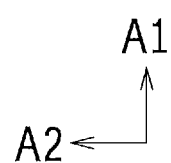
Figure 4:
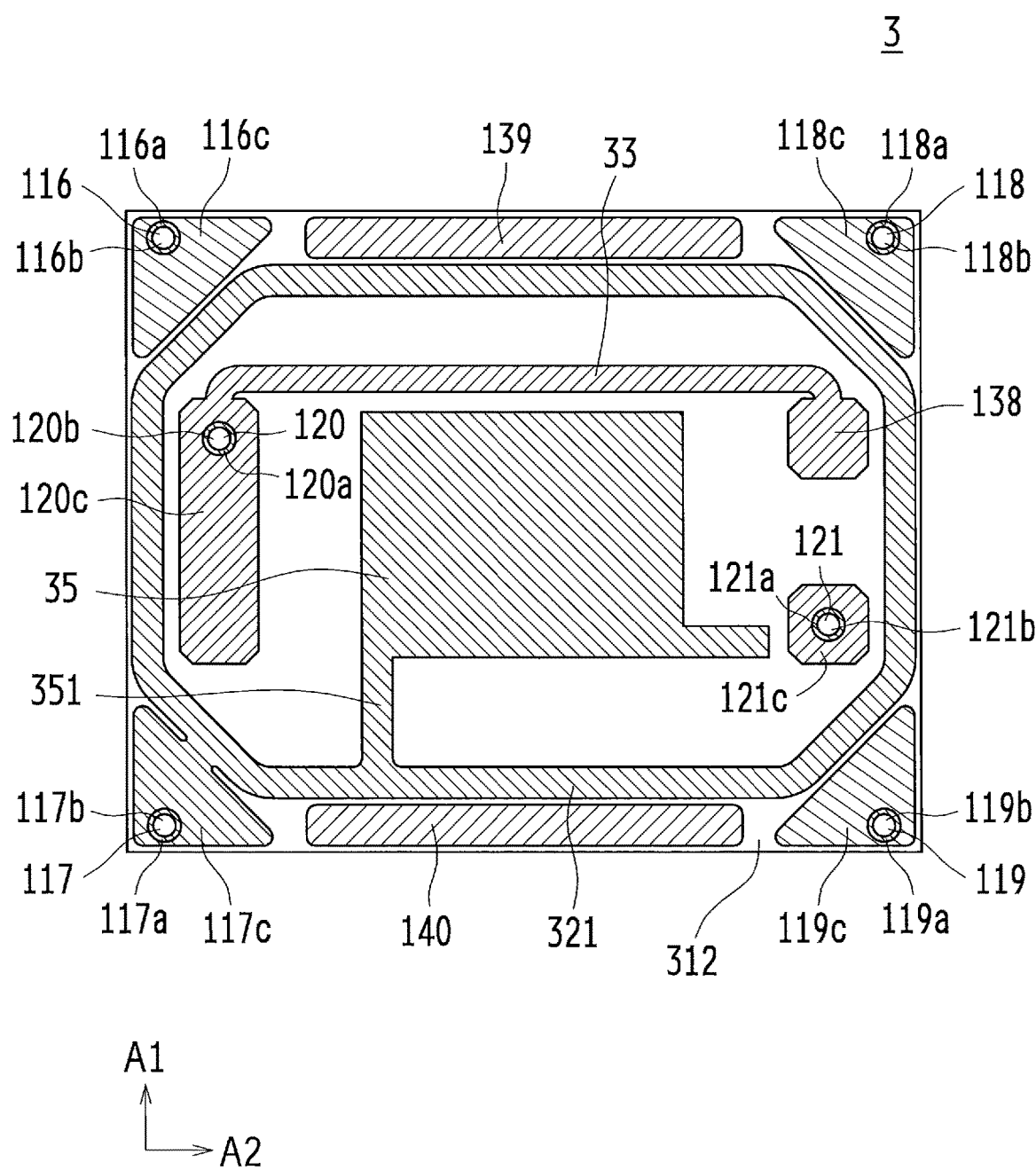
FIG. 4 is a schematic rear view illustrating the first sealing member of the crystal resonator.

The first sealing member 3 is made of a material having the flexural rigidity (moment of inertia of area×Young's modulus) of not more than 1000 [N·mm$^2$]. Specifically, as shown in FIGS. 3 and 4, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first bonding pattern 321 is formed as a sealing-member-side first sealing part so as to be bonded to the crystal resonator plate 2. The sealing-member-side first bonding pattern 321 is formed so as to have an annular shape in plan view.

The sealing-member-side first bonding pattern 321 is constituted of a base PVD film deposited on the first sealing member 3 by the physical vapor deposition, and an electrode PVD film deposited on the base PVD film by the physical vapor deposition. In this embodiment, the base PVD film is made of Ti, and the electrode PVD film is made of Au. Also, the sealing-member-side first bonding pattern 321 does not contain Sn.

A shown in FIGS. 3 and 4, on the first main surface 311 (the surface on which the IC chip 5 is mounted) of the first sealing member 3, six electrode patterns 37 are formed, which include mounting pads for mounting the IC chip 5 as an oscillation circuit element. In FIG. 3, the region on which the IC chip 5 is mounted is virtually shown as the dashed line. These six electrode patterns 37 are connected, respectively, to the sixth to eleventh through holes 116 to 121.

In the first sealing member 3, the six through holes (the sixth to eleventh through holes 116 to 121) are formed so as to penetrate between a first main surface 311 and the second main surface 312. The sixth to ninth through holes 116 to 119 are respectively disposed at the four corners (corner parts) of the first sealing member 3. The tenth and eleventh through holes 120 and 121 are disposed on both side in the A2 direction in FIG. 4.

The sixth through hole 116 is connected to the first through hole 111 of the crystal resonator plate 2. The seventh through hole 117 is connected to the second through hole 112 of the crystal resonator plate 2. The eighth through hole 118 is connected to the third through hole 113 of the crystal resonator plate 2. The ninth through hole 119 is connected to the fourth through hole 114 of the crystal resonator plate 2. The tenth through hole 120 is connected to the fifth through hole 115 of the crystal resonator plate 2 via the wiring pattern 33. The eleventh through hole 121 is connected to the first extraction electrode 223 drawn from the first excitation electrode 221.

In the sixth to eleventh through holes 116 to 121, through electrodes 116a to 121a are respectively formed along a corresponding inner wall surface of the sixth to eleventh through holes 116 to 121 so as to establish conduction between the electrodes formed on the first main surface 311 and the second main surface 312. Respective central parts of the sixth to eleventh through holes 116 to 121 are hollow through parts 116b to 121b penetrating between the first main surface 311 and the second main surface 312. Connection bonding patterns 116c to 121c are formed on respective outer peripheries of the sixth to eleventh through holes 116 to 121. The connection bonding patterns 116c to 121c are formed on the second main surface 312 of the first sealing member 3.

The connection bonding patterns 116c to 121c have the same configuration as the sealing-member-side first bonding pattern 321, accordingly, they can be formed by the same process as that for the sealing-member-side first bonding pattern 321. Specifically, each of the connection bonding patterns 116c to 121c is constituted of a base PVD film deposited on the second main surface 312 of the first sealing member 3 by the physical vapor deposition, and an electrode PVD film deposited on the base PVD film by the physical vapor deposition.

The connection bonding patterns 116c to 119c of the sixth to ninth through holes 116 to 119 are respectively provided at the four corners (corner parts) of the second main surface 312 of the first sealing member 3 so that they are provided at a predetermined interval from the sealing-member-side first bonding pattern 321. The connection bonding pattern 120c of the tenth through hole 120 extends in the A1 direction in FIG. 4, and it is integrally formed with the wiring pattern 33. Also on the second main surface 312 of the first sealing member 3, a connection bonding pattern 138 is disposed on the side opposite to the connection bonding pattern 120c in the A2 direction with the wiring pattern 33 being interposed therebetween. That is, the connection bonding pattern 120c is connected to one end of the wiring pattern 33 in the A2 direction while the connection bonding pattern 138 is connected to the other end thereof. Note that the A1 direction and the A2 direction in FIG. 4 respectively correspond to the X axis direction and the Z' axis direction in FIG. 5.

Also on the second main surface 312 of the first sealing member 3, connection bonding patterns 139 and 140 are provided on regions close to the respective long sides (regions along the respective long sides) of the first sealing member 3. The connection bonding patterns 139 and 140 extend in the A2 direction in FIG. 4. The connection bonding pattern 139 is disposed between the connection bonding pattern 116c and the connection bonding pattern 118c formed on the second main surface 312 of the first sealing member 3. The connection bonding pattern 140 is disposed between the connection bonding pattern 117c and the connection bonding pattern 119c.

In the crystal resonator 101, the sixth to ninth through holes 116 to 119 and the connection bonding patterns 116c to 119c, 139 and 140 are disposed outside the outer periphery of the sealing-member-side first bonding pattern 321. The tenth and eleventh through holes 120 and 121 and the connection bonding patterns 120c, 121c and 138 are disposed inside the inner periphery of the sealing-member-side first bonding pattern 321. The connection bonding patterns 116c to 121c and 138 to 140 are not electrically connected to the sealing-member-side first bonding pattern 321, except for the connection bonding pattern 117c. Also, the wiring pattern 33 is not electrically connected to the sealing-member-side first bonding pattern 321.

Figure 7:
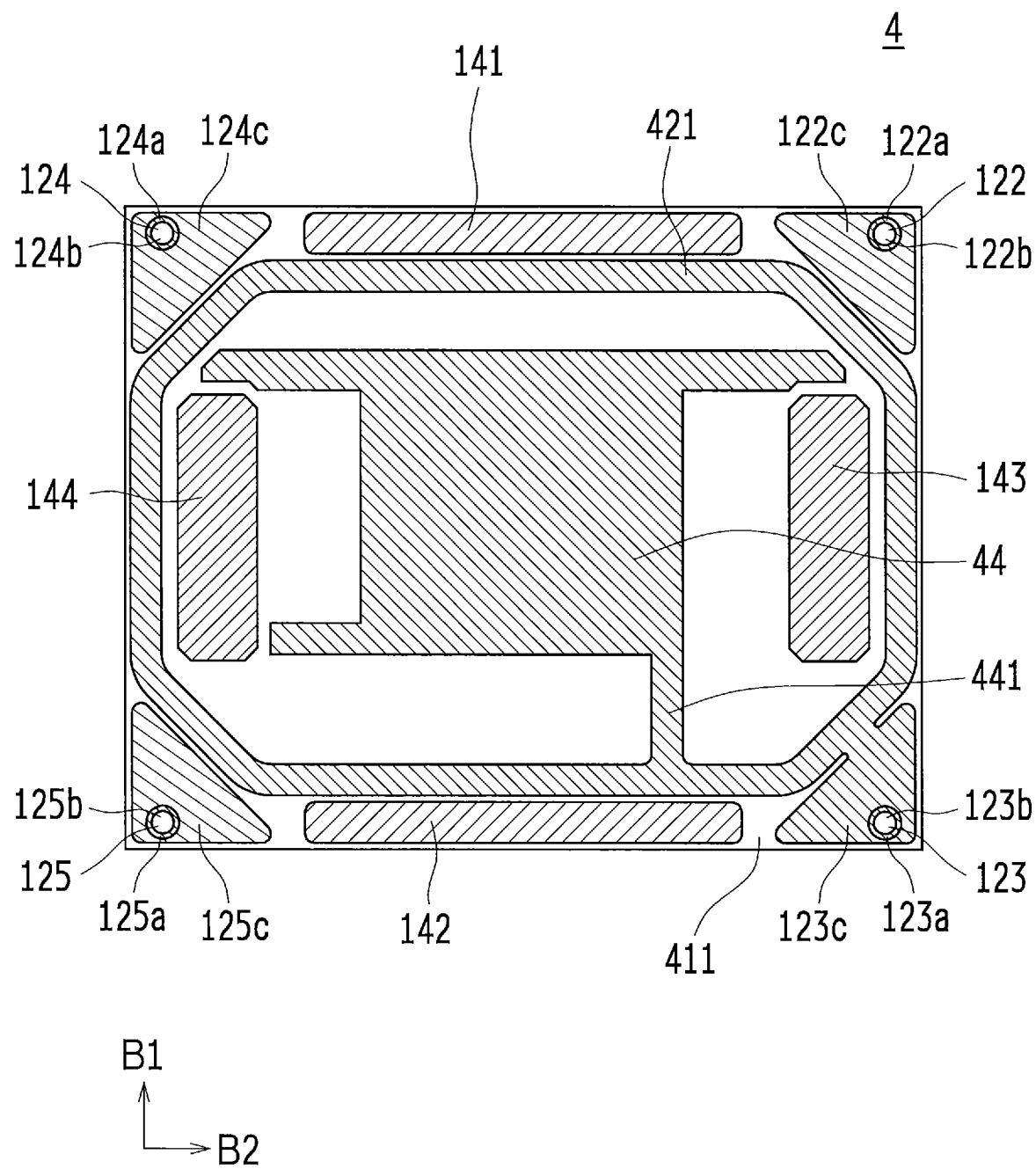
FIG. 7 is a schematic plan view illustrating a second sealing member of the crystal resonator.
Figure 8:
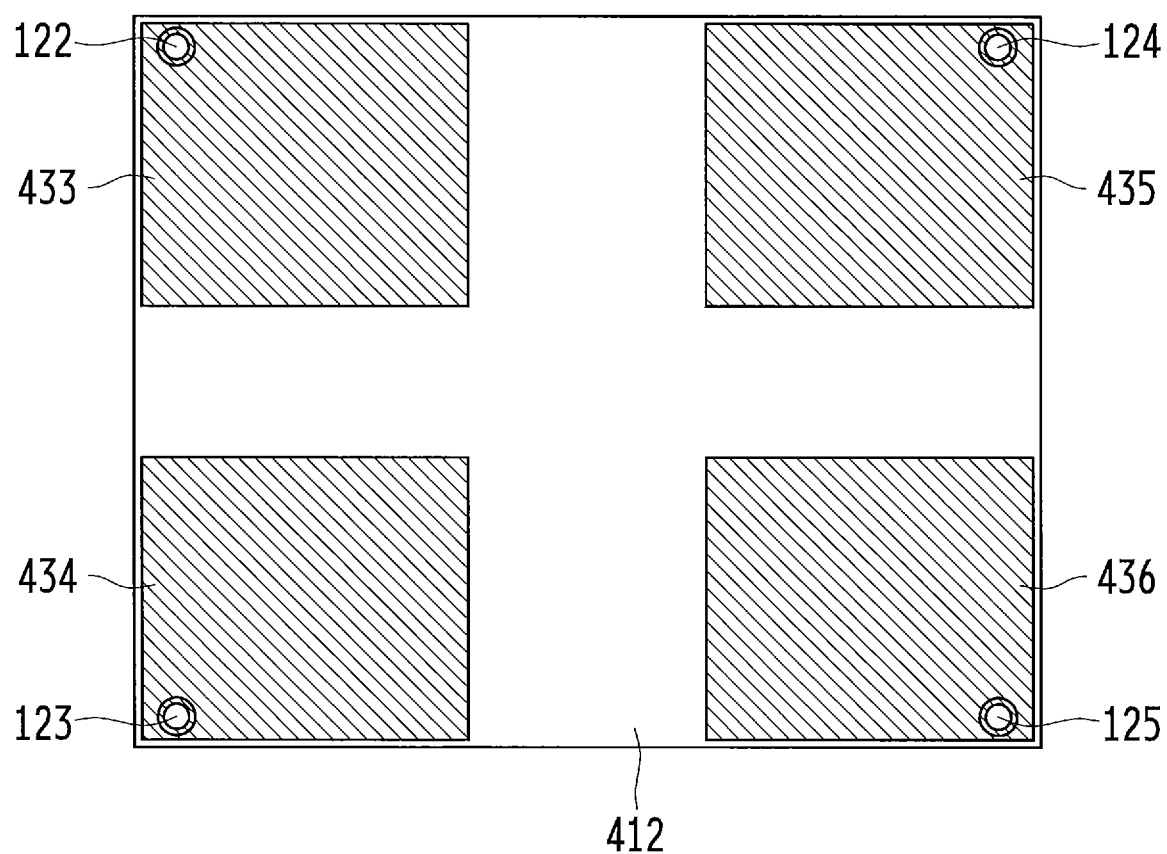
FIG. 8 is a schematic rear view illustrating the second sealing member of the crystal resonator.

The second sealing member 4 is made of a material having the flexural rigidity (moment of inertia of area× Young's modulus) of not more than 1000 [N·mm²]. Specifically, as shown in FIGS. 7 and 8, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second bonding pattern 421 is formed as a sealing-member-side second sealing part so as to be bonded to the crystal resonator plate 2. The sealing-member-side second bonding pattern 421 is formed so as to have an annular shape in plan view.

The sealing-member-side second bonding pattern 421 is constituted of a base PVD film deposited on the second sealing member 4 by the physical vapor deposition, and an electrode PVD film deposited on the base PVD film by the physical vapor deposition. In this embodiment, the base PVD film is made of Ti, and the electrode PVD film is made of Au. Also, the sealing-member-side second bonding pattern 421 does not contain Sn.

Four external electrode terminals (first to fourth external electrode terminals 433 to 436), which are electrically connected to the outside, are formed on a second main surface 412 (the outer main surface not facing the crystal resonator plate 2) of the second sealing member 4. The first to fourth external electrode terminals 433 to 436 are respectively located at four corner (corner parts) of the second sealing member 4. These external electrode terminals (the first to fourth external electrode terminals 433 to 436) are each constituted of a base PVD film deposited on the second main surface 412 by the physical vapor deposition, and an electrode PVD film deposited on the base PVD film by the physical vapor deposition.

As shown in FIGS. 7 and 8, four through holes (the twelfth to fifteenth through holes 122 to 125) are formed in the second sealing member 4 so as to penetrate between the first main surface 411 and the second main surface 412. The twelfth to fifteenth through holes 122 to 125 are respectively disposed at the four corners (corner parts) of the second sealing member 4. The twelfth through hole 122 is connected to the first external electrode terminal 433 and to the first through hole 111 of the crystal resonator plate 2. The thirteenth through hole 123 is connected to the second external electrode terminal 434 and to the second through hole 112 of the crystal resonator plate 2. The fourteenth through hole 124 is connected to the third external electrode terminal 435 and to the third through hole 113 of the crystal resonator plate 2. The fifteenth through hole 125 is connected to the fourth external electrode terminal 436 and to the fourth through hole 114 of the crystal resonator plate 2.

In the twelfth to fifteenth through holes 122 to 125, through electrodes 122a to 125a are respectively formed along a corresponding inner wall surface of the twelfth to fifteenth through holes 122 to 125 so as to establish conduction between the electrodes formed on the first main surface 411 and the second main surface 412. Respective central parts of the twelfth to fifteenth through holes 122 to 125 are hollow through parts 122b to 125b penetrating between the first main surface 411 and the second main surface 412. Connection bonding patterns 122c to 125c are formed on respective outer peripheries of the twelfth to fifteenth through holes 122 to 125. The connection bonding patterns 122c to 125c are formed on the first main surface 411 of the second sealing member 4.

The connection bonding patterns 122c to 125c have the same configuration as the sealing-member-side second bonding pattern 421, accordingly, they can be formed by the same process as that for the sealing-member-side second bonding pattern 421. Specifically, each of the connection bonding patterns 122c to 125c is constituted of a base PVD film deposited on the first main surface 411 of the second sealing member 4 by the physical vapor deposition, and an electrode PVD film deposited on the base PVD film by the physical vapor deposition.

The connection bonding patterns 122c to 125c of the twelfth to fifteenth through holes 122 to 125 are respectively provided at the four corners (corner parts) of the first main surface 411 of the second sealing member 4 so that they are provided at a predetermined interval from the sealing-member-side second bonding pattern 421. Also, on the first main surface 411 of the second sealing member 4, connection bonding patterns 141 and 142 are provided on regions close to the respective long sides (regions along the respective long sides) of the second sealing member 4. The connection bonding patterns 141 and 142 extend in the B2 direction in FIG. 7. The connection bonding pattern 141 is disposed between the connection bonding pattern 122c and the connection bonding pattern 124c formed on the first main surface 411 of the second sealing member 4. The connection bonding pattern 142 is disposed between the connection bonding pattern 123c and the connection bonding pattern 125c.

Also on the first main surface 411 of the second sealing member 4, connection bonding patterns 143 and 144 are provided so as to extend in the B1 direction in FIG. 7. The connection bonding patterns 143 and 144 are respectively disposed on both end parts in the B2 direction in FIG. 7. The connection bonding pattern 143 is disposed between the connection bonding pattern 122c and the connection bonding pattern 123c formed on the first main surface 411 of the second sealing member 4. The connection bonding pattern 144 is disposed between the connection bonding pattern 124c and the connection bonding pattern 125c. Note that the B1 direction and the B2 direction in FIG. 7 respectively correspond to the X axis direction and the Z' axis direction in FIG. 5.

In the crystal resonator 101, the twelfth to fifteenth through holes 122 to 125 and the connection bonding patterns 122c to 125c, 141 and 142 are disposed outside the outer periphery of the sealing-member-side second bonding pattern 421. The connection bonding patterns 143 and 144 are disposed inside the inner periphery of the sealing-member-side second bonding pattern 421. The connection bonding patterns 122c to 125c and 141 to 144 are not electrically connected to the sealing-member-side second bonding pattern 421, except for the connection bonding pattern 123c.

In the crystal resonator 101 including the crystal resonator plate 2, the first sealing member 3 and the second sealing member 4, the crystal resonator plate 2 and the first sealing member 3 are subjected to the diffusion bonding in a state in which the resonator-plate-side first bonding pattern 251 and the sealing-member-side first bonding pattern 321 are superimposed on each other, and the crystal resonator plate 2 and the second sealing member 4 are subjected to the diffusion bonding in a state in which the resonator-plate-side second bonding pattern 252 and the sealing-member-side second bonding pattern 421 are superimposed on each other, thus, the package 12 having the sandwich structure is produced. Thus, the internal space 13 of the package 12, i.e. the space to house the vibrating part 22 is hermetically sealed without using, separately, any special bonding material such as an adhesive.

As shown in FIG. 1, the resonator-plate-side first bonding pattern 251 and the sealing-member-side first bonding pattern 321 themselves serve as a bonding material 15a formed upon the diffusion bonding. The resonator-plate-side second bonding pattern 252 and the sealing-member-side second bonding pattern 421 themselves serve as a bonding material 15b formed upon the diffusion bonding.

In this case, the respective connection bonding patterns as described above are also subjected to the diffusion bonding in a state in which they are each superimposed on the corresponding connection bonding pattern. Specifically, the connection bonding patterns 111c to 114c at the four corners of the crystal resonator plate 2 and the connection bonding patterns 116c to 119c at the four corners of the first sealing member 3 are subjected to the diffusion bonding. The connection bonding patterns 133 and 134 on the regions close to the respective long sides of the crystal resonator plate 2 and the connection bonding patterns 139 and 140 on the regions close to the respective long sides of the first sealing member 3 are subjected to the diffusion bonding. The connection bonding pattern 115c of the crystal resonator plate 2 and the connection bonding pattern 138 of the first sealing member 3 are subjected to the diffusion bonding. The connection bonding pattern 131 of the crystal resonator plate 2 and the connection bonding pattern 121c of the first sealing member 3 are subjected to the diffusion bonding. The connection bonding pattern 132 of the crystal resonator plate 2 and the connection bonding pattern 120c of the first sealing member 3 are subjected to the diffusion bonding. The bonding materials formed by the above connection bonding patterns themselves upon the diffusion bonding serve to establish conduction between the through electrodes of the through holes, and to hermetically seal the bonding parts.

Similarly to the above, the connection bonding patterns 111c to 114c at the four corners of the crystal resonator plate 2 and the connection bonding patterns 122c to 125c at the four corners of the second sealing member 4 are subjected to the diffusion bonding. The connection bonding patterns 136 and 137 on the regions close to the respective long sides of the crystal resonator plate 2 and the connection bonding patterns 141 and 142 on the regions close to the respective long sides of the second sealing member 4 are subjected to the diffusion bonding. The connection bonding pattern 115c of the crystal resonator plate 2 and the connection bonding pattern 144 of the second sealing member 4 are subjected to the diffusion bonding. The connection bonding pattern 135 of the crystal resonator plate 2 and the connection bonding pattern 143 of the second sealing member 4 are subjected to the diffusion bonding.

[Shield Structure of Piezoelectric Resonator Device]

Figure 9:
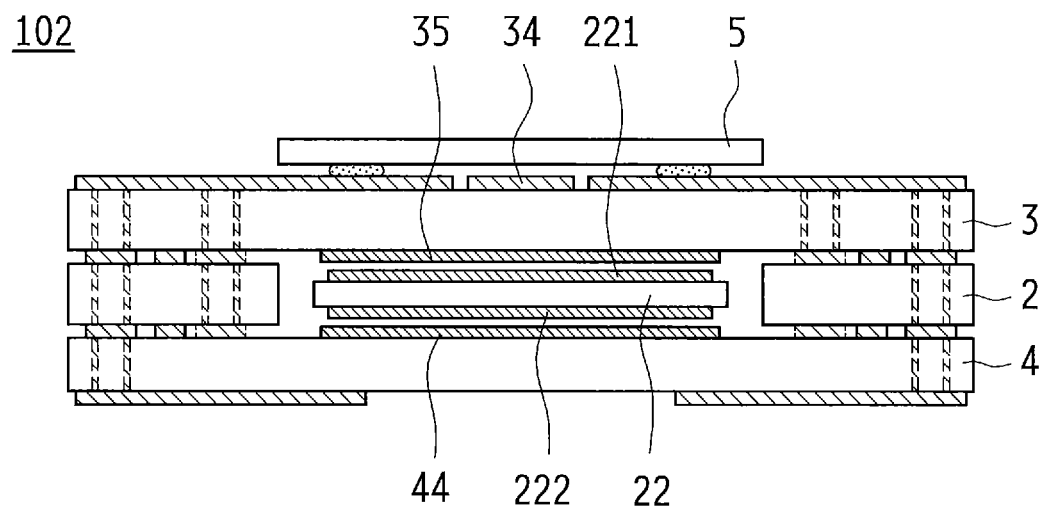
FIG. 9 is a schematic cross-sectional view illustrating an example of the crystal oscillator to which a shield structure of the present invention is applied.

Here, the shield structure as the advantageous configuration of the present invention is described. The shield structure of the present invention includes a plurality of shield electrodes. FIG. 9 is a schematic cross-sectional view illustrating an example of the crystal oscillator 102 to which the shield structure of the present invention is applied.

As shown in FIG. 9, the shield structure according to this embodiment mainly includes first to third shield electrodes 34, 35 and 44. Hereinafter, the shape of each shield electrode is described referring to FIGS. 3, 4 and 7.

As shown in FIG. 3, the first shield electrode 34 is formed on the first main surface 311 of the first sealing member 3. The first shield electrode 34 is to prevent potential fluctuations caused by the IC chip 5 and is disposed so as to cover an area on which no electrode pattern 37 is provided in the region on which the IC chip 5 is mounted.

In order to prevent influence caused by potential fluctuations of the terminals and wiring, a fixed potential that does not fluctuate during operation of the crystal oscillator 102 should be applied to the shield electrode. It is preferable that a GND (ground) potential is used as the fixed potential. For this reason, the first shield electrode 34 is electrically connected to one of the electrode patterns 37 formed on the first main surface 311 of the first sealing member 3. That is, in this embodiment, the second external electrode terminal 434 is the external electrode terminal for GND connection. The electrode pattern 37 that is connected to the first shield electrode 34 is wiring that is connected to the second external electrode terminal 434 so that the GND potential is applied to the IC chip 5. Thus, the GND potential is constantly applied to the first shield electrode 34.

As shown in FIG. 4, the second shield electrode 35 is formed on the second main surface 312 of the first sealing member 3. The second shield electrode 35 is a shield electrode to shield the first excitation electrode 221, the second excitation electrode 222, the first extraction electrode 223 and the second extraction electrode 224, all of which are formed on the crystal resonator plate 2, from above (i.e. from the surface side opposite to the surface to be mounted on the circuit). The second shield electrode 35 is patterned and formed so as to be superimposed on these excitation electrodes and extraction electrodes in plan view, and furthermore, is electrically connected to neither the connection bonding patterns 120c, 121c and 138 nor the wiring pattern 33. On the other hand, the second shield electrode 35 is electrically connected to the sealing-member-side first bonding pattern 321 via a connection wiring 351, and the sealing-member-side first bonding pattern 321 is electrically connected to the connection bonding pattern 117c. By this connection, the GND potential is applied to the second shield electrode 35 from the connection bonding pattern 117c.

It is preferable that the connection wiring 351, which connects the second shield electrode 35 to the sealing-member-side first bonding pattern 321, is arranged at a position as close as possible to the connection bonding pattern 117c for GND connection. With this configuration, the conduction path between the second shield electrode 35 and the connection bonding pattern 117c can be shortened, which prevents generation of an unnecessary inductance component. Thus, the GND potential becomes stable, which results in stable electrical characteristics of the piezoelectric resonator device.

As shown in FIG. 7, the third shield electrode 44 is formed on the first main surface 411 of the second sealing member 4. The third shield electrode 44 is a shield electrode to shield, from below (i.e. from the surface side to be mounted on the circuit), the following: the first excitation electrode 221, the second excitation electrode 222, the first extraction electrode 223 and the second extraction electrode 224, all of which are formed on the crystal resonator plate 2; and the wiring pattern 33 formed on the first sealing member 3. The third shield electrode 44 is patterned and formed so as to be superimposed on these electrodes and wiring in plan view, and furthermore, is not electrically connected to the connection bonding patterns 143 and 144. On the other hand, the third shield electrode 44 is electrically connected to the sealing-member-side second bonding pattern 421 via a connection wiring 441, and the sealing-member-side second bonding pattern 421 is electrically connected to the connection bonding pattern 123c. By this connection, the GND potential is applied to the third shield electrode 44 from the connection bonding pattern 123c.

It is preferable that the connection wiring 441, which connects the third shield electrode 44 to the sealing-member-side second bonding pattern 421, is arranged at a position as close as possible to the connection bonding pattern 123c for GND connection. With this configuration, the conduction path between the third shield electrode 44 and the connection bonding pattern 123c can be shortened, which prevents generation of an unnecessary inductance component. Thus, the GND potential becomes stable, which results in stable electrical characteristics of the piezoelectric resonator device.

In the crystal resonator 101 or the crystal oscillator 102 according to this embodiment, the first to third shield electrodes 34, 35 and 44 are provided as the shield structure suitable for the sandwich structure. These shield electrodes can be formed by the same process as that for the electrodes, the wiring, the connection bonding patterns and the like that are formed on the first sealing member 3 and the second sealing member 4. Specifically, each of the first to third shield electrodes 34, 35 and 44 is constituted of a base PVD film deposited by the physical vapor deposition, and an electrode PVD film deposited on the base PVD film by the physical vapor deposition.

In this embodiment, the crystal oscillator 102 is described, which includes all of the first to third shield electrodes 34, 35 and 44. However, the present invention is not limited thereto. The crystal oscillator may include at least any of the shield electrodes. For example, the first shield electrode 34 is to prevent potential fluctuations caused by the IC chip 5. However, normally, the IC chip 5 is produced so as to include, in itself, shielding means. In such a case, the first shield electrode 34 can be omitted.

Also, as shown in FIGS. 5 and 6, the first excitation electrode 221 and the second excitation electrode 222 are respectively surrounded by the resonator-plate-side first bonding pattern 251 and the resonator-plate-side second bonding pattern 252. Furthermore, the resonator-plate-side first bonding pattern 251 and the resonator-plate-side second bonding pattern 252 are respectively connected to the second shield electrode 35 and the third shield electrode 44. Thus, the GND potential is also applied to the resonator-plate-side first bonding pattern 251 and the resonator-plate-side second bonding pattern 252. Accordingly, the resonator-plate-side first bonding pattern 251 and the resonator-plate-side second bonding pattern 252 can also shield the first excitation electrode 221 and the second excitation electrode 222 in the horizontal direction, which improves the shielding effect. Thus, in the crystal resonator 101 or the crystal oscillator 102 according to this embodiment, it is possible to obtain the shielding effect not only from the first to third shield electrodes 34, 35 and 44 that shield the excitation electrodes in the vertical direction but also from the resonator-plate-side first bonding pattern 251 and the resonator-plate-side second bonding pattern 252. In this way, since the excitation region (i.e. the region where the excitation electrodes are formed) is completely surrounded by shielding, it is possible to improve the shielding effect and to further stabilize the electrical characteristics of the piezoelectric resonator device.

The second and third shield electrodes 35 and 44 are the shield electrodes arranged in the internal space 13 of the package 12. The second and third shield electrodes 35 and 44 are not electrically connected to the first excitation electrode 221 and the second excitation electrode 222, but electrically connected to the fixed potential (preferably, the GND potential). In the piezoelectric resonator device having the sandwich structure, the thickness of the package is small. Thus, in such a piezoelectric resonator device, there are small distances respectively between the mounting terminals outside the package and the excitation electrodes/internal wiring, which tends to cause capacitive coupling. In contrast, in the crystal resonator 101, since the second and third shield electrodes 35 and 44 are arranged in the internal space 13 of the package 12, it is possible to prevent characteristic variations due to the capacitive coupling.

Also, the second and third shield electrodes 35 and 44 are patterned respectively on the inner surface sides of the first sealing member 3 and the second sealing member 4 at positions corresponding to the arrangements of the respective excitation electrodes and extraction electrodes. More specifically, the second and third shield electrodes 35 and 44 are patterned such that they are superimposed, respectively, on the first excitation electrode 221 and the first extraction electrode 223, and on the second excitation electrode 222 and the second extraction electrode 224, of the crystal resonator plate 2, in plan view. In this way, since the second and third shield electrodes 35 and 44 are patterned such that they conform with the respective shapes of arranged electrodes and wiring to be shielded, it is possible to minimize the area for forming the second and third shield electrodes 35 and 44, which leads to reduction in parasitic capacitance generated by the second and third shield electrodes 35 and 44. When the parasitic capacitance is reduced, it is possible to prevent reduction in the frequency variable amount of the excitation electrode, which leads to the frequency easily controlled in the piezoelectric resonator device.

The above shape of the shield electrode is only described as an example, thus the present invention is not limited thereto. Hereinafter, variations of the shield electrode will be described.

Figure 10:
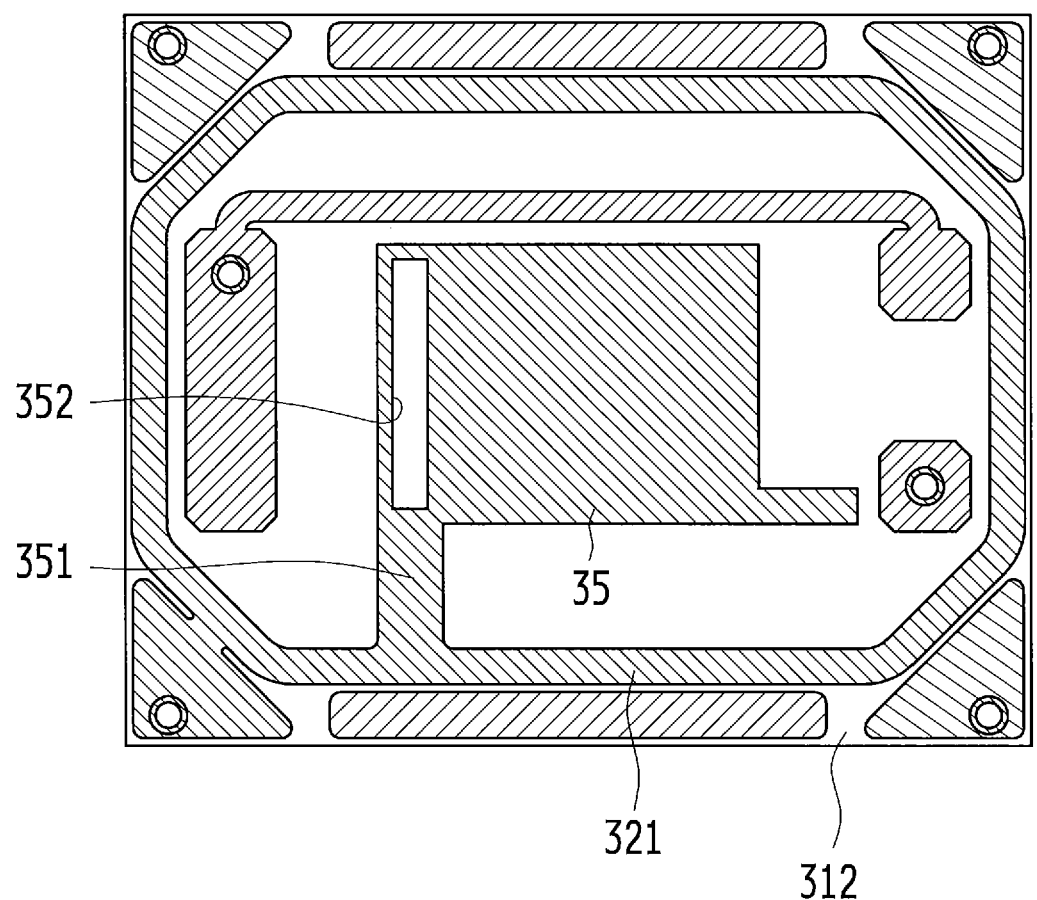
FIG. 10 is a schematic rear view of the first sealing member of the crystal resonator, which illustrates a variation of a shield electrode.

FIG. 10 illustrates a variation of the second shield electrode 35. The second shield electrode 35 shown in FIG. 10 has an opening 352. The opening 352 is formed at a position facing an edge of the first excitation electrode 221 that has the maximum bending width when the vibrating part 22 of the crystal resonator plate 2 is bent by impact. The edge of the first excitation electrode 221 having the maximum bending width is, more specifically, an edge opposed to the side of the vibrating part 22 on which the connecting part 24 is provided. That is, the opening 352 of the second shield electrode 35 is disposed so as to prevent the first excitation electrode 221 from making contact with the second shield electrode 35 when an impact occurs.

When the first excitation electrode 221 makes contact with the second shield electrode 35, an instantaneous short circuit may occur between these electrodes, which may result in change in the vibration frequency of the crystal oscillator 102. Furthermore, when each surface of the first excitation electrode 221 and the second shield electrode 35 is an Au layer, the contact may cause Au—Au bonding so that one Au layer is peeled off to be adhered to the other Au layer. In this case, the mass of the vibrating part 22 in the crystal resonator plate 2 changes, which may change the vibration frequency of the crystal oscillator 102. Therefore, it is possible to prevent such defects by forming the opening 352 in the second shield electrode 35 so as to avoid the contact between the first excitation electrode 221 and the second shield electrode 35. In FIG. 10, the opening 352 is formed in the second shield electrode 35. However, such an opening may be formed in the third shield electrode 44.

Figure 11:
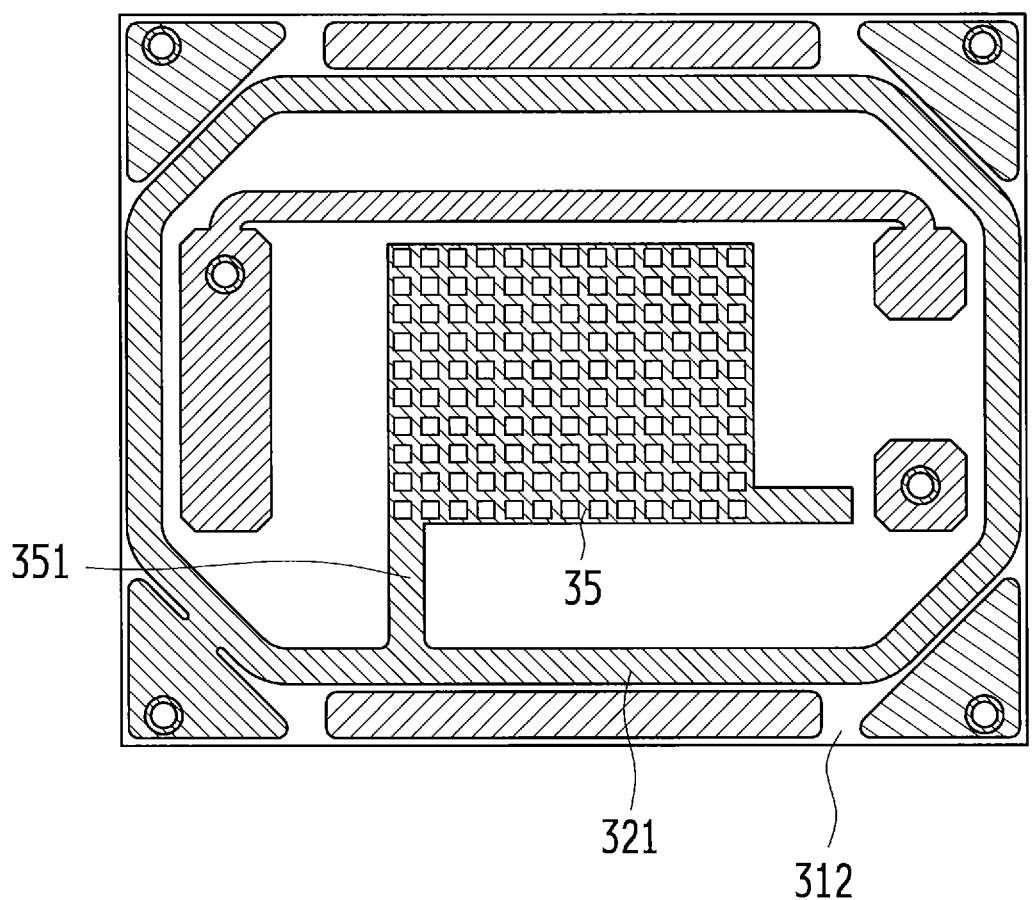
FIG. 11 is a schematic rear view of the first sealing member of the crystal resonator, which illustrates a variation of a shield electrode.
Figure 11:
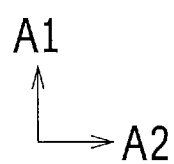

FIG. 11 illustrates a variation of the second shield electrode 35. The second shield electrode 35 shown in FIG. 11 is not only patterned in accordance with the shapes of the excitation electrode and the extraction electrode, but also formed as a mesh electrode. When the second shield electrode 35 has a fine mesh size to a certain extent, it is expected that the shielding effect similar to the second shield electrode 35 shown in FIG. 4 can be obtained. Furthermore, by forming the second shield electrode 35 as a mesh electrode, the facing area of the first excitation electrode 221 and the second shield electrode 35 is decreased, which further reduces the parasitic capacitance generated by the second shield electrode 35. In FIG. 11, the second shield electrode 35 is formed as a mesh electrode. However, the third shield electrode 44 may also be formed as a mesh electrode.

Figure 12:
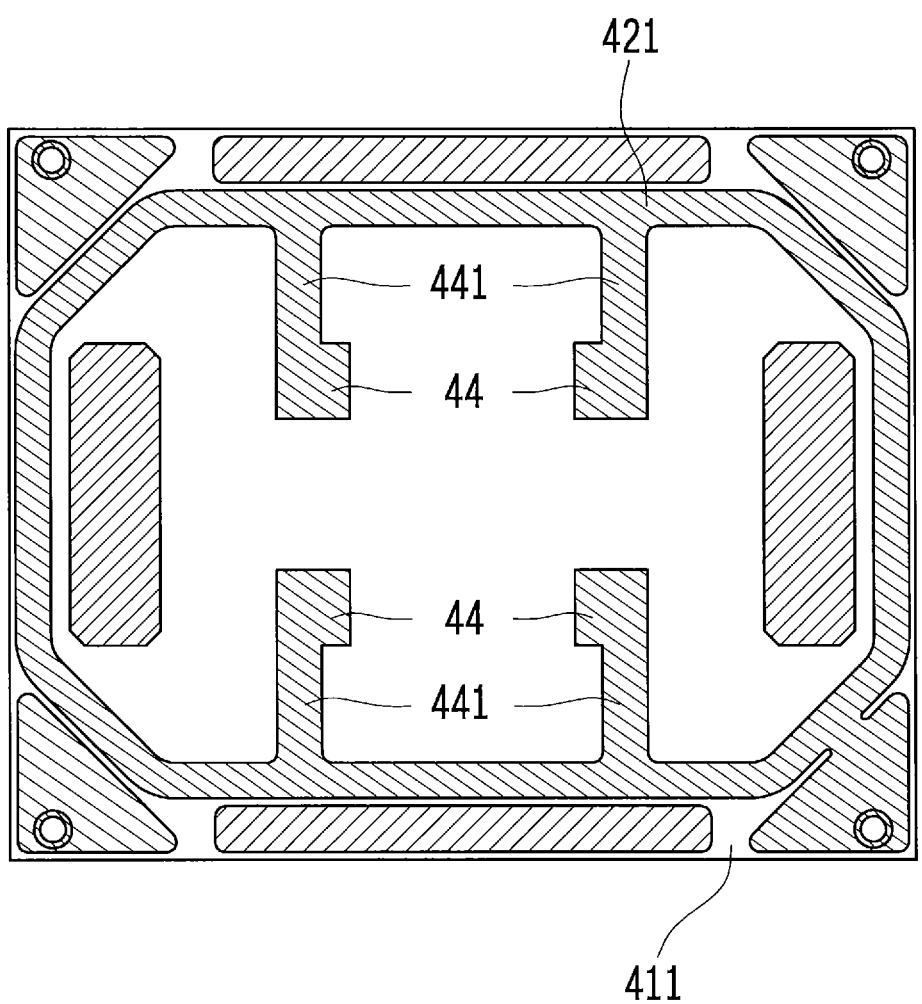
FIG. 12 is a schematic plan view of the second sealing member of the crystal resonator, which illustrates a variation of a shield electrode.
Figure 12:
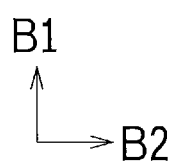

FIG. 12 illustrates a variation of the third shield electrode 44. On the first main surface 411 of the second sealing member 4 shown in FIG. 12, four third shield electrodes 44 are provided. The third shield electrodes 44 are patterned and formed so as not to entirely shield the first and second excitation electrodes 221 and 222, but to shield only the superimposed parts made by superimposing the first and second excitation electrodes 221 and 222 on the first to fourth external electrode terminals 433 to 436. In other words, the third shield electrodes 44 shield the regions where the second excitation electrode 222 is superimposed on the external electrode terminals 433 to 436, and the other region facing the second excitation electrode 222 is opened.

When capacitive coupling occurs between the first to fourth external electrode terminals 433 to 436 and the first and second excitation electrodes 221 and 222, the crystal resonator 101 is affected by potential change in the first to fourth external electrode terminals 433 to 436, which results in characteristic variations such as a frequency variation. In order to prevent such characteristic variations, it is sufficient to prevent the capacitive coupling between the first to fourth external electrode terminals 433 to 436 and the first and second excitation electrodes 221 and 222. Since the above capacitive coupling is caused by superimposition of the first and second excitation electrodes 221 and 222 on the first to fourth external electrode terminals 433 to 436, it is sufficient to shield only such superimposed regions with the third shield electrodes 44. With the configuration shown in FIG. 12, it is possible to minimize the areas of the third shield electrodes 44. Thus, the total facing area of the second excitation electrode 222 and the third shield electrodes 44 is decreased, which further reduces the parasitic capacitance generated by the third shield electrodes 44.

In the configuration shown in FIG. 12, the third shield electrodes 44 respectively have the connection wirings 441. However, the multiple third shield electrodes 44 may share the connection wiring 441 so as to be electrically connected to the sealing-member-side second bonding pattern 421.

As described above, in the variation of the third shield electrodes 44 shown in FIG. 12, only the regions where first and second excitation electrodes 221 and 222 are superimposed on the other electrodes and wiring are shielded while the other facing region is opened so that the parasitic capacitance is further reduced. Such a configuration may also be applied to the first shield electrode 34 and the second shield electrode 35.

In this embodiment, the first sealing member 3 and the second sealing member 4 are made of glass, however, the present invention is not limited thereto. They may be made of crystal. Also, the piezoelectric resonator plate is made of AT-cut crystal, however, it may be made of crystal other than the AT-cut crystal. Furthermore, the piezoelectric resonator plate may be made of any other material provided that it is a piezoelectric material (e.g. lithium niobate and lithium tantalite).

The first sealing member 3 and the second sealing member 4 are made of crystal, accordingly, the crystal resonator plate 2, the first sealing member 3 and the second sealing member 4 have the same coefficient of thermal expansion, which can prevent deformation of the package 12 caused by the difference in the coefficient of thermal expansion among the crystal resonator plate 2, the first sealing member 3 and the second sealing member 4. Thus, it is possible to improve hermeticity of the internal space 13 into which the vibrating part 22 of the crystal resonator plate 2 is hermetically shielded. Also, when the package 12 is deformed, such distortion is transmitted to the first excitation electrode 221 and the second excitation electrode 222 via the connecting part 24, which may cause frequency variations. However, it is possible to prevent such frequency variations by making all of the crystal resonator plate 2, the first sealing member 3 and the second sealing member 4 of crystal.

Also in this embodiment, the first sealing member 3 is bonded to the crystal resonator plate 2, and the crystal resonator plate 2 is bonded to the second sealing member 4, both by Au—Au diffusion bonding. However, the present invention is not limited thereto. They may be bonded to each other using brazing material.

The foregoing embodiment is to be considered in all respects as illustrative and not limiting. The scope of the invention is indicated by the appended claims rather than by the foregoing description, and all modifications and changes that come within the meaning and range of equivalency of the claims are intended to be embraced therein.

DESCRIPTION OF REFERENCE NUMERALS

101 Crystal resonator (piezoelectric resonator device)
102 Crystal oscillator (piezoelectric resonator device)
2 Crystal resonator plate (piezoelectric resonator plate)
3 First sealing member
4 Second sealing member
5 IC chip
12 Package
13 Internal space
111-125 First to fifteen through holes
22 Vibrating part
23 External frame part
24 Connecting part
221 First excitation electrode
222 Second excitation electrode
34 First shield electrode (shield electrode)
35 Second shield electrode (shield electrode)
37 Electrode pattern
433-436 First to fourth external electrode terminals
44 Third shield electrode (shield electrode)

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
shield electrodes, which are not electrically connected to the first excitation electrode and the second excitation electrode but are connected to a fixed potential, are provided in the internal space, and
the shield electrodes are respectively patterned such that the shield electrodes are respectively superimposed on the first excitation electrode and the second excitation electrode in plan view.

2. The piezoelectric resonator device according to claim 1, wherein
the shield electrodes are respectively patterned on inner surface sides of the first sealing member and the second sealing member at positions corresponding to shapes of the first excitation electrode and the second excitation electrode formed on the piezoelectric resonator plate.

3. The piezoelectric resonator device according to claim 1, wherein
an IC chip is mounted on the first sealing member, and at least one of the shield electrodes is disposed on a surface on which the IC chip is mounted.

4. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
shield electrodes, which are not electrically connected to the first excitation electrode and the second excitation electrode but are connected to a fixed potential, are provided in the internal space,
the piezoelectric resonator plate includes:
the vibrating part formed so as to have a substantially rectangular shape;
an external frame part surrounding an outer periphery of the vibrating part; and
a connecting part connecting the vibrating part to the external frame part, and
at least one of the shield electrodes includes an opening that is formed at a position facing respective edges of the first excitation electrode and the second excitation electrode, the edges being on a side opposed to a side having the connecting part of the vibrating part.

5. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
shield electrodes, which are not electrically connected to the first excitation electrode and the second excitation electrode but are connected to a fixed potential, are provided in the internal space,
an external electrode terminal is formed on an outer surface of the second sealing member such that the piezoelectric resonator device is mounted on a circuit board, and
at least one of the shield electrodes, which is formed on an inner surface of the second sealing member, shields a region where the second excitation electrode is superimposed on the external electrode terminal while the other region facing the second excitation electrode is opened.

* * * * *